United States Patent
Li et al.

(10) Patent No.: US 11,906,552 B1
(45) Date of Patent: Feb. 20, 2024

(54) VOLTAGE MEASURING METHOD, COMPUTER DEVICE AND STORAGE MEDIUM

(71) Applicant: DIGITAL GRID RES. INST, CHINA SOUTHERN POWER GRID, Guangzhou (CN)

(72) Inventors: Peng Li, Guangzhou (CN); Bing Tian, Guangzhou (CN); Zhong Liu, Guangzhou (CN); Bofeng Luo, Guangzhou (CN); Zhiming Wang, Guangzhou (CN); Licheng Li, Guangzhou (CN); Xiaopeng Fan, Guangzhou (CN); Senjing Yao, Guangzhou (CN); Qiancheng Lv, Guangzhou (CN); Zhenheng Xu, Guangzhou (CN); Renze Chen, Guangzhou (CN); Yuehuan Lin, Guangzhou (CN); Xu Yin, Guangzhou (CN); Jiaming Zhang, Guangzhou (CN); Jie Wei, Guangzhou (CN); Zejie Tan, Guangzhou (CN)

(73) Assignee: DIGITAL GRID RES. INST, CHINA SOUTHERN POWER GRID, Guangzhou (CN)

(*) Notice: Subject to any disclaimer, the term of this patent is extended or adjusted under 35 U.S.C. 154(b) by 0 days.

(21) Appl. No.: 18/228,302

(22) Filed: Jul. 31, 2023

(30) Foreign Application Priority Data

Sep. 30, 2022 (CN) .......................... 202211218742.2

(51) Int. Cl.
*G01R 15/06* (2006.01)
*G01R 19/00* (2006.01)
*G01R 25/00* (2006.01)

(52) U.S. Cl.
CPC ......... *G01R 15/06* (2013.01); *G01R 19/0084* (2013.01); *G01R 25/00* (2013.01)

(58) Field of Classification Search
CPC ........ G01R 15/00; G01R 15/04; G01R 15/06; G01R 19/00; G01R 19/0084; G01R 19/0092; G01R 25/00
(Continued)

(56) References Cited

U.S. PATENT DOCUMENTS

2008/0312856 A1  12/2008  Feight et al.

FOREIGN PATENT DOCUMENTS

| CN | 201697961 U | * | 1/2011 | ........... G01R 19/165 |
| CN | 103323655 A | | 9/2013 | |

(Continued)

OTHER PUBLICATIONS

Chinese Office Action for corresponding Application No. 202211218742.2 dated Nov. 9, 2022, 10 pages.

*Primary Examiner* — Hoai-An D. Nguyen
(74) *Attorney, Agent, or Firm* — Seyfarth Shaw LLP (57) ABSTRACT

The present disclosure relates to a voltage measuring method, a computer device and a storage medium. The method includes: determining, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device; adjusting the coupling capacitances, and determining, by the voltage measuring device after the adjustment of the coupling capacitances, a current measured voltage; and determining, based on the measured voltage by the voltage measuring device before the adjustment of the coupling capacitances and the measured voltage (Continued)

by the voltage measuring device after the adjustment of the coupling capacitances, a voltage of a phase conductor of the three-phase conductor to be measured.

18 Claims, 6 Drawing Sheets

(58) Field of Classification Search
USPC .............................................. 324/76.11, 126
See application file for complete search history.

(56) References Cited

FOREIGN PATENT DOCUMENTS

| | | | | |
|---|---|---|---|---|
| CN | 106771505 | A | 5/2017 | |
| CN | 106932648 | A | 7/2017 | |
| CN | 106970268 | A | 7/2017 | |
| CN | 110470879 | A | 11/2019 | |
| CN | 113341203 | A | 9/2021 | |
| CN | 113358912 | A | 9/2021 | |
| CN | 113447698 | A | 9/2021 | |
| CN | 114264890 | A | 4/2022 | |
| CN | 114487564 | A | 5/2022 | |
| DE | 102012209019 | B3 * | 8/2013 | ........... G01R 31/086 |
| WO | WO-2008052495 | A1 * | 5/2008 | ............. G01R 15/06 |

* cited by examiner

VOLTAGE MEASURING METHOD, COMPUTER DEVICE AND STORAGE MEDIUM

CROSS-REFERENCE TO RELATED APPLICATIONS

The present application claims priority to Chinese patent application No. 2022112187422, filed on Sep. 30, 2022, the entire content of which is incorporated herein by reference.

TECHNICAL FIELD

The present disclosure relates to the field of computer technology, and in particular, to a voltage measuring method, a computer device and a storage medium.

BACKGROUND

With the continuous development of power grid technology, voltage measurement is increasingly widely used in power systems to ensure the normal operation of power grid equipment. The accuracy, reliability, convenience, and speed of voltage measurement are related to the normal execution of electricity metering, relay protection, power system monitoring and diagnosis, and other processing.

In related art, a voltage of a three-phase conductor may be measured using an electromagnetic voltage transformer. The metal parts of the lines of the three-phase conductor needs to be led out and then connected to the electromagnetic voltage transformer for voltage measurement.

However, in some voltage measurement scenarios, there are situations where it is impossible to quickly strip off an insulation layer or inconvenient to damage the insulation. The staff often needs to perform tedious operations before using the electromagnetic voltage transformer to measure the voltage of the three-phase conductor, resulting in inconvenience in voltage measurement in related art.

SUMMARY

In a first aspect, the present disclosure provides a voltage measuring method, including: determining, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; adjusting the coupling capacitances, and determining, by the voltage measuring device after the adjustment of the coupling capacitances, a current measured voltage; and determining, based on the measured voltage by the voltage measuring device before the adjustment of the coupling capacitances and the measured voltage by the voltage measuring device after the adjustment of the coupling capacitances, a voltage of a phase conductor of the three-phase conductor to be measured.

In an embodiment, the measured voltage is determined, under an effect of different frequencies of the reference AC power supply and voltages of the three phase conductors, based on a sum of the voltage of the phase conductor to be measured and an interference voltage, and the interference voltage varies linearly with change of the coupling capacitances.

In an embodiment, the determining, based on the measured voltage by the voltage measuring device before the adjustment of the coupling capacitances and the measured voltage by the voltage measuring device after the adjustment of the coupling capacitances, the voltage of the phase conductor of the three-phase conductor to be measured includes: acquiring a first phase voltage value and a first phase angle of the measured voltage by the voltage measuring device before the adjustment of the coupling capacitances, and acquiring a second phase voltage value and a second phase angle of the measured voltage by the voltage measuring device after the adjustment of the coupling capacitances; the first phase angle and the second phase angle being each an angle between the corresponding measured voltage and the voltage of the phase conductor to be measured; and determining, based on the first phase voltage value, the first phase angle, the second phase voltage value and the second phase angle, the voltage of the phase conductor to be measured in the case that the interference voltage varies linearly with the change of the coupling capacitances.

In an embodiment, the determining the current measured voltage by the voltage measuring device includes: determining a current voltage of the voltage dividing capacitor in the voltage measuring device; acquiring a preset voltage of the reference AC power supply in the voltage measuring device; and determining, based on the current voltage of the voltage dividing capacitor and the preset voltage of the reference AC power supply, the current measured voltage by the voltage measuring device.

In an embodiment, the determining the current voltage of the voltage dividing capacitor in the voltage measuring device includes: acquiring a detected voltage of the voltage dividing capacitor in the voltage measuring device; the detected voltage being a voltage collected under a combined effect of the reference AC power supply and the voltages of the three phase conductors; and decomposing the detected voltage to obtain a first decomposition voltage of the voltage dividing capacitor under separate effect of the voltages of the three phase conductors at the frequency of the AC power supply, and a second decomposition voltage of the voltage dividing capacitor under separate effect of the reference AC power supply at the frequency of the reference AC power supply.

In an embodiment, the determining, based on the current voltage of the voltage dividing capacitor and the preset voltage of the reference AC power supply, the current measured voltage by the voltage measuring device includes: acquiring a ratio of the first decomposition voltage to the second decomposition voltage; and obtaining, based on a product of the ratio and the preset voltage of the reference AC power supply, the current measured voltage by the voltage measuring device.

In an embodiment, the voltage measuring device further includes a toggle switch, as well as a first electrode plate, a second electrode plate and a third electrode plate used to form the coupling capacitances, and the first electrode plate, the voltage dividing capacitor, the reference AC power supply, the second electrode plate, the toggle switch and the third electrode plate are connected sequentially. The adjusting the coupling capacitances includes: changing a state of the toggle switch, and obtaining adjusted coupling capacitances after change of the state of the toggle switch, the state of the toggle switch including an open state or a closed state.

In a second aspect, the present disclosure further provides a computer device including a processor and a memory storing computer programs. The computer programs, when executed by the processor, cause the processor to: determine, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; adjust the coupling capacitances, and determine, by the voltage measuring device after the adjustment of the coupling capacitances, a current measured voltage; and determine, based on the measured voltage by the voltage measuring device before the adjustment of the coupling capacitances and the measured voltage by the voltage measuring device after the adjustment of the coupling capacitances, a voltage of a phase conductor of the three-phase conductor to be measured.

In a third aspect, the present disclosure further provides a non-temporary computer-readable storage medium storing computer programs. The computer programs, when executed by a processor, cause the processor to: determine, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; adjust the coupling capacitances, and determine, by the voltage measuring device after the adjustment of the coupling capacitances, a current measured voltage; and determine, based on the measured voltage by the voltage measuring device before the adjustment of the coupling capacitances and the measured voltage by the voltage measuring device after the adjustment of the coupling capacitances, a voltage of a phase conductor of the three-phase conductor to be measured.

One or more embodiments of the present disclosure will be described in detail below with reference to drawings. Other features, objects and advantages of the present disclosure will become more apparent from the description, drawings, and claims.

DETAILED DESCRIPTION OF THE EMBODIMENTS

In order to make the purpose, technical solutions and advantages of the present disclosure more clearly understood, the disclosure will be further described in detail with the accompanying drawings and embodiments. It should be understood that the specific embodiments described here are only used to explain the disclosure and not to limit the disclosure.

With the continuous development of power grid technology, voltage measurement is increasingly widely used in power systems to ensure the normal operation of power grid equipment. The accuracy, reliability, convenience, and speed of voltage measurement are related to the normal execution of electricity metering, relay protection, power system monitoring and diagnosis, and other processing.

In related art, a voltage of a three-phase conductor may be measured using an electromagnetic voltage transformer. The electromagnetic voltage transformer is usually hooked up to the line during power outage to acquire the required voltage information. Specifically, when installing the electromagnetic voltage transformer, the metal parts of the lines of the three-phase conductor to be measured are required to be led out and then connected to the electromagnetic voltage transformer for voltage measurement. However, when actual voltage measurement is needed, in many complex environments, it is often impossible to strip off an insulation layer or inconvenient to damage the insulation. When setting up temporary voltage information collection points, the above method for installing and removing the electromagnetic voltage transformer is also quite inconvenient, seriously affecting the efficiency of voltage measurement.

Figure 1:
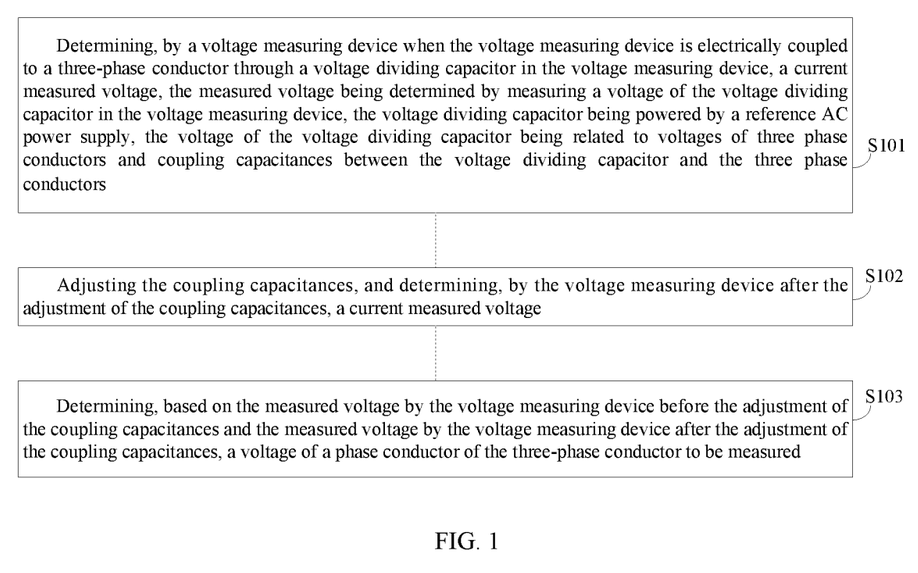
FIG. 1 is a flow diagram illustrating a voltage measuring method in an embodiment.

In an embodiment, a voltage measuring method is provided as shown in FIG. 1. In the present embodiment, the method is described by taking its application to a voltage measuring device as an example, and it should be understood that the method may also be applied to other devices for voltage measurement. In the present embodiment, the method includes following steps S101-S103.

At step S101, a current measured voltage is determined by the voltage measuring device when the voltage measuring device is electrically coupled to a three-phase conductor through a voltage dividing capacitor in the voltage measuring device. The measured voltage is determined by measuring a voltage of the voltage dividing capacitor in the voltage measuring device. The voltage dividing capacitor is powered by a reference AC power supply. The voltage of the voltage dividing capacitor is related to voltages of three phase conductors and coupling capacitances between the voltage dividing capacitor and the three phase conductors.

The three phase conductors include an A-phase conductor, a B-phase conductor and a C-phase conductor.

Specifically, the voltage measuring device may be configured with the voltage dividing capacitor and the reference AC power supply which supplies power to the voltage dividing capacitor. When measuring a voltage of a phase conductor of the three-phase conductor to be measured, the voltage measuring device may be placed close to the three-phase conductor to be measured. The voltage measuring device and the three-phase conductor to be measured are in a non-contact state, and a distance between the voltage measuring device and the three-phase conductor to be measured is within a preset range.

When the reference AC power supply supplies power to the voltage dividing capacitor, the voltage measuring device may generate coupling capacitances with three phase conductors through the voltage dividing capacitor, and thereby forms electrical coupling with the three phase conductors due to the presence of the voltage dividing capacitor. Corresponding coupling capacitances are formed between the voltage dividing capacitor and each phase conductor of the three-phase conductor. In other words, the voltage dividing capacitor in the voltage measuring device can be electrically coupled to the three phase conductors to form a corresponding circuit. In the circuit, the voltage of the voltage dividing capacitor is related to the voltages of the three phase conductors and the coupling capacitances between the voltage dividing capacitor and the three phase conductors, i.e., the magnitude of the voltage of the voltage dividing capacitor will vary with the voltages of the three phase conductors and the coupling capacitances.

During the measurement process, the voltage measuring device may measure the voltage of the voltage dividing capacitor by a measuring element in the voltage measuring device and determine the corresponding measured voltage. The voltage measuring device may acquire the measured voltage related to the voltage of the voltage dividing capacitor by the measuring element to obtain the specific voltage value. Since the measured voltage is acquired based on the voltage of the voltage dividing capacitor, and the voltage of the voltage dividing capacitor is related to the voltages of the three phase conductors and the coupling capacitances, the voltage of the voltage dividing capacitor and the measured voltage will vary with the coupling capacitances under the condition that the three-phase conductor remains stable and unchanged.

At step S102, the coupling capacitances are adjusted, and a current measured voltage is determined by the voltage measuring device after the adjustment of the coupling capacitances.

After acquiring the measured voltage currently read by the voltage measuring device, the coupling capacitances between the voltage dividing capacitor and the three phase conductors may be adjusted, and the measured voltage currently read by the voltage measuring device can be determined again after the coupling capacitances have been adjusted. Specifically, since the value of the voltage read by the voltage measuring device is actually related to the voltage of the voltage dividing capacitor, and the voltage of the voltage dividing capacitor varies with the coupling capacitances, the measured voltage read by the voltage measuring device will also change when the coupling capacitances are adjusted.

At step S103, the voltage of the phase conductor of the three-phase conductor to be measured is determined based on the measured voltage by the voltage measuring device before the adjustment of the coupling capacitances and the measured voltage by the voltage measuring device after the adjustment of the coupling capacitances.

The phase conductor to be measured may be any one of the A-phase conductor, B-phase conductor and C-phase conductor.

After obtaining the measured voltages acquired by the voltage measuring device before and after the adjustment of the coupling capacitances, the voltage of the phase conductor of the three-phase conductor to be measured may be determined based on the two measured voltages acquired. Actually, since the corresponding voltages of the phase conductor to be measured and conductors in the three-phase conductor other than the phase conductor to be measured are constant before and after changing the coupling capacitances, by acquiring the measured voltages before and after the change of the coupling capacitances, the voltage of the phase conductor to be measured can be calculated. In the present disclosure, when measuring the voltage of the phase conductor to be measured, the voltage measuring device does not need to make physical contact with the conductors to be measured. The staff does not need to make additional processing to address the high-voltage insulation problem, and does not need to damage the insulation layer of the phase conductor to be measured. The voltage measuring device is easy to install and arrange, without requirements for physical connection-type installation during power outage, and is therefore applicable to voltage measurement of conductors of various voltage levels.

In the present embodiment, the current measured voltage by the voltage measuring device may be determined under the condition that the electrical coupling are formed between the voltage measuring device and the three-phase conductor through the voltage dividing capacitor in the voltage measuring device. The measured voltage is determined by measuring the voltage of the voltage dividing capacitor in the voltage measuring device. The voltage dividing capacitor is powered by a reference AC power supply. The voltage of the voltage dividing capacitor is related to the voltages of the three phase conductors and the coupling capacitances between the voltage dividing capacitor and the three phase conductors. Then the coupling capacitances may be adjusted, and the current measured voltage by the voltage measuring device is determined after the adjustment of the coupling capacitances. In addition, the voltage of the phase conductor of the three-phase conductor to be measured may be determined based on the measured voltage by the voltage measuring device before the adjustment of the coupling capacitances and the measured voltage by the voltage measuring device after the adjustment of the coupling capacitances. In the present disclosure, the voltage measuring device may form a corresponding circuit by forming the coupling capacitances between the voltage dividing capacitor and the three phase conductors for electrical coupling without physically contacting the three-phase conductor, and the voltage of the phase conductor to be measured may be determined based on the measured voltages acquired by the voltage measuring device before and after the change of the coupling capacitances. It is not necessary to connect the voltage measuring device to the circuit for the phase conductor to be measured by physical connection, which effectively improves the convenience and efficiency of voltage measurement.

Figure 2:
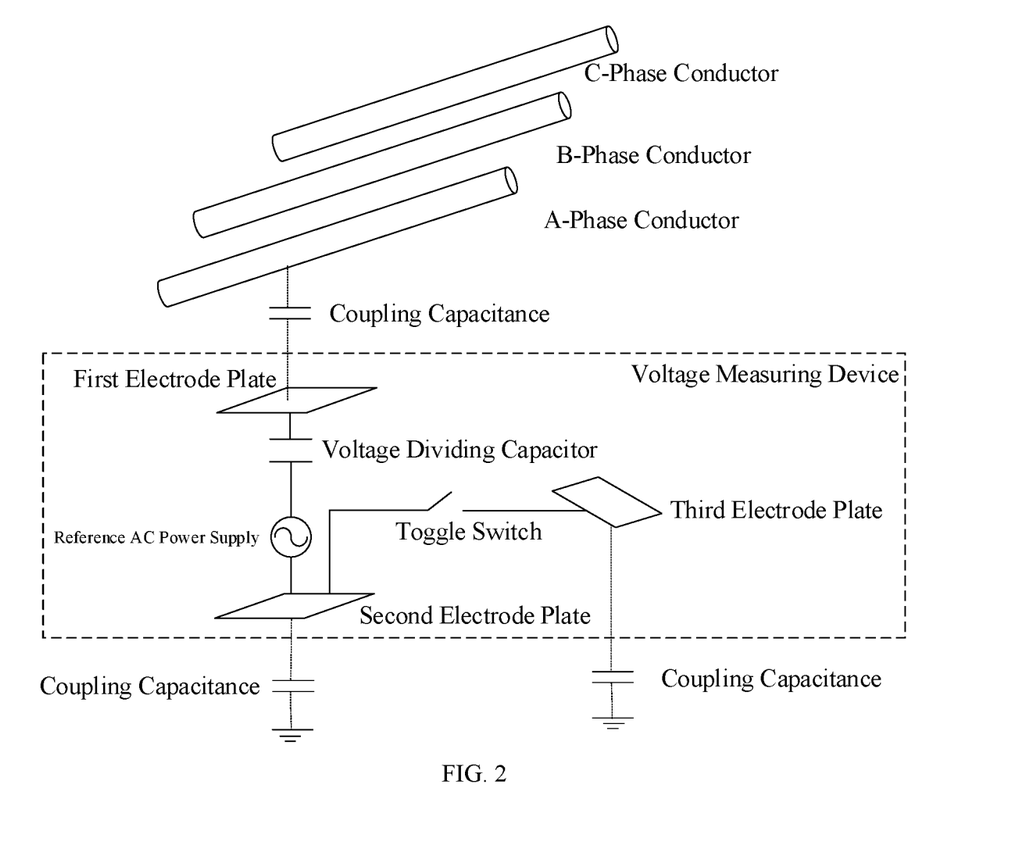
FIG. 2 is a schematic diagram illustrating a measurement in an embodiment.

In an embodiment, the voltage measuring device further includes a toggle switch, as well as a first electrode plate, a second electrode plate and a third electrode plate used to form the coupling capacitances. The first electrode plate, the voltage dividing capacitor, the reference AC power supply, the second electrode plate, the toggle switch and the third electrode plate are connected sequentially.

Specifically, FIG. 2 shows a schematic measurement between the voltage measuring device and the three-phase conductor. An exemplary configuration of the voltage measuring device is shown in the dashed box and may include the first electrode plate, the second electrode plate, the third electrode plate, the reference AC power supply, the voltage dividing capacitor, and the toggle switch. Each electrode plate, which can also be called a capacitive sensing probe, may be a very thin (the thickness of the electrode plate is within a preset range), flat rectangular body with a square cross section. The first electrode plate (which may also be called a first probe) and the second electrode plate (which may also be called a second probe) are placed in parallel, and the third electrode plate (which may also be called a third probe) and the second electrode plate are not parallel. In practical applications, copper foil may be selected as each electrode plate.

Correspondingly, the adjusting the coupling capacitances in the step S102 may include: changing a state of the toggle switch, and obtaining adjusted coupling capacitances after the change of the state of the toggle switch.

In practical applications, the state of the toggle switch may include an open state or a closed state. In the open state, the second electrode plate and the third electrode plate are not connected, and in the closed state, the second electrode plate and the third electrode plate are connected. By changing the state of the toggle switch, the connectivity between the second electrode plate and the third electrode plate may be changed, thus affecting the coupling capacitances between the voltage dividing capacitor and the three phase conductors.

In the present embodiment, the coupling capacitances between the voltage dividing capacitor and the three phase conductors can be quickly changed by adjusting the state of the toggle switch, providing a basis for obtaining the measured voltages in different states. Moreover, the configuration of the voltage measuring device in present embodiment is simple, requiring only basic components such as three electrode plates, the reference AC power supply, the voltage dividing capacitor and the toggle switch, etc. The low cost and simple structure enhance the convenience of producing and using the voltage measuring device.

Figure 3:
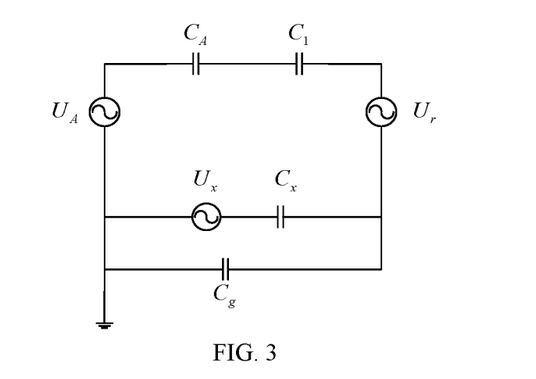
FIG. 3 shows a circuit for a schematic measurement in an embodiment.

In an embodiment, A circuit for the schematic measurement as shown in FIG. 2 is shown in FIG. 3. $U_A$ denotes a voltage of the A-phase conductor to be measured. $U_r$ denotes a sinusoidal AC voltage generated by the reference AC power supply, frequency $f_r$ of which may be pre-set to different values according to actual situations and is known. $U_x$ denotes an equivalent interference voltage of the B-phase conductor and the C-phase conductor ($U_x$ may also be called an interference voltage source). $C_A$ denotes a coupling capacitance between the voltage measuring device and the A-phase conductor, $C_x$ denotes a coupling capacitance between the voltage measuring device and the B-phase conductor and C-phase conductor, Cg denotes a coupling capacitance between the voltage measuring device and the ground, and $C_1$ denotes a voltage dividing capacitance in the voltage measuring device, which may be set according to the actual situation and is known.

Figure 4A:
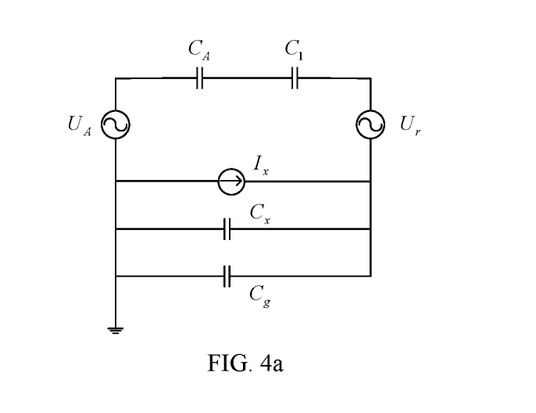
FIG. 4a shows a schematic circuit in an embodiment.

In a specific implementation, the voltage of the three-phase conductor is a sinusoidal voltage signal. In the measurement process, the frequency of the reference AC power supply is different from the frequency of the voltage of the three-phase conductor, for example, the voltage signal of the reference AC power supply $U_r$ is a sinusoidal voltage signal with a frequency greater than the power system frequency 50 Hz, while $U_A$, $U_B$ and $U_C$ are the voltage of each phase of the three-phase conductor respectively, which are specifically a sinusoidal voltage signal with a frequency of 50 Hz. Based on Davinan's theorem and Norton's theorem, the circuit shown in FIG. 3 may be simplified and transformed, and in the simplified transformation process, the circuit diagram shown in FIG. 3 is sequentially changed to the circuit diagrams shown in FIG. 4a and FIG. 4b.

Figure 4B:
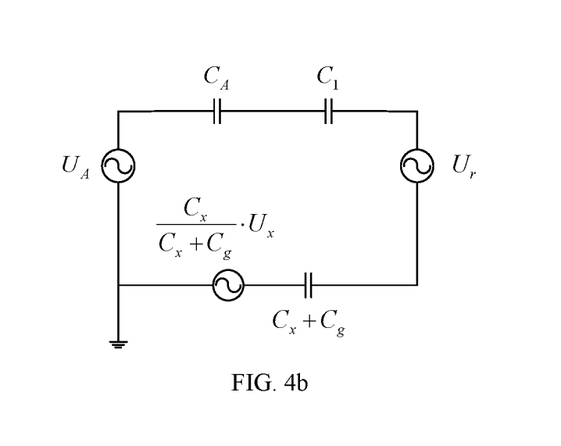
FIG. 4b shows another schematic circuit in an embodiment.

In the circuit diagram shown in FIG. 4b, the voltage $U_A$ and the voltage $$\frac{C_x}{C_x + C_g} U_x$$

are sinusoidal voltage signals of frequency $f_s$, and the reference AC power supply Ur is a sinusoidal voltage signal of frequency $f_r$. Based on the circuit superposition theorem, if multiple sinusoidal AC (alternating current) power supplies with different frequencies act collectively in a linear AC circuit, a voltage through any element of the circuit is equal to the sum of the voltages generated by each power supply when acting alone on that element after the circuit reaches a stable state.

Based on this, the circuit shown in FIG. 4b may be decoupled into two circuits of frequency $f_s$ and frequency $f_r$ respectively in the present embodiment, and a relationship between the voltage dividing capacitor and other circuit elements in the corresponding circuits may be determined respectively.

Figure 5A:
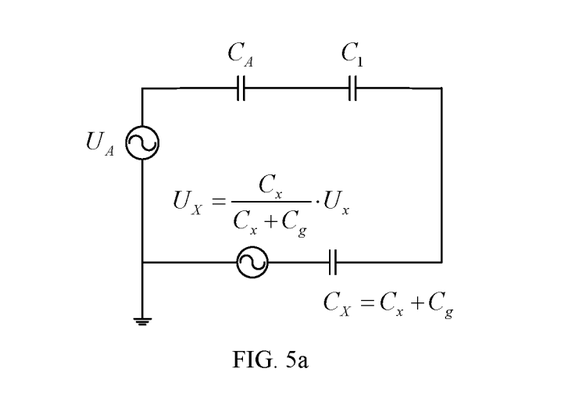
FIG. 5a shows another schematic circuit in an embodiment.

When the circuit is operating at the operating frequency $f_s$ of the three-phase conductor, the voltage $U_A$ and voltage $$\frac{C_x}{C_x + C_g} U_x$$

still exist, and the reference AC power supply $U_r$ is short-circuited, the circuit diagram shown in FIG. 4b may be equated to the circuit diagram shown in FIG. 5a. Based on the circuit diagram shown in FIG. 5a and the relationship between the capacitance and the frequency, an impedance of the coupling capacitance $C_A$ at the operating frequency $f_s$ may be denoted as:

$$Z_{As} = \frac{1}{2\pi f_S C_A}. \tag{1}$$

An impedance of the voltage dividing capacitance $C_1$ at the operating frequency fs may be denoted as:

$$Z_{1s} = \frac{1}{2\pi f_S C_1}. \tag{2}$$

An impedance of the coupling capacitance $C_X$ at the operating frequency fs may be denoted as:

$$Z_{Xs} = \frac{1}{2\pi f_S C_X}. \tag{3}$$

Based on a voltage dividing equation of the circuit, a detected voltage $V_s$ on the voltage dividing capacitor may be denoted as:

$$V_S = \frac{Z_{1S}}{Z_{As} + Z_{1S} + Z_{Xs}} (U_A + U_X). \tag{4}$$

Combining the equations of the impedance of the coupling capacitance $C_A$, voltage dividing capacitance $C_1$, and coupling capacitance $C_X$, the equation of the detected voltage Vs is simplified and denoted as:

$$V_S = \frac{\frac{1}{C_1}}{\frac{1}{C_A} + \frac{1}{C_1} + \frac{1}{C_X}}(U_A + U_X). \tag{5}$$

Figure 5B:
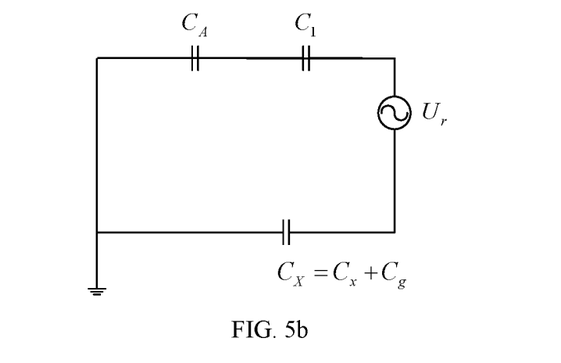
FIG. 5b shows another schematic circuit in an embodiment.

Correspondingly, when the circuit is operating at the reference frequency $f_r$ of the reference AC power supply, the circuit diagram shown in FIG. 4b may be equated to the circuit diagram shown in FIG. 5b. Based on the circuit diagram shown in FIG. 5b and the relationship between capacitance and frequency, an impedance of the coupling capacitance $C_A$ at the reference frequency $f_r$ may be denoted as:

$$Z_{Ar} = \frac{1}{2\pi f_r C_A}. \tag{6}$$

An impedance of the voltage dividing capacitance $C_1$ at the reference frequency $f_r$ may be denoted as:

$$Z_{1r} = \frac{1}{2\pi f_r C_1}. \tag{7}$$

An impedance of the coupling capacitance $C_X$ at the reference frequency $f_r$ may be denoted as:

$$Z_{Xr} = \frac{1}{2\pi f_r C_X}. \tag{8}$$

Based on a voltage dividing equation of the circuit, a detected voltage $V_r$ on the voltage dividing capacitor may be denoted as:

$$V_r = \frac{Z_{1r}}{Z_{Ar} + Z_{1r} + Z_{Xr}} U_r. \tag{9}$$

Combining the equations the impedance of the coupling capacitance $C_A$, voltage dividing capacitance $C_1$, and coupling capacitance $C_X$, the equation of the detected voltage $V_r$ is simplified and denoted as:

$$V_r = \frac{\frac{1}{C_1}}{\frac{1}{C_A} + \frac{1}{C_1} + \frac{1}{C_X}} U_r. \tag{10}$$

Combining the equation (5) and equation (10), the following equations (11)-(14) can be obtained:

$$\frac{V_r}{V_s} = \frac{U_r}{U_A + U_X}, \tag{11}$$

$$U_A + U_X = \frac{V_s}{V_r} U_r = U_{S1}, \tag{12}$$

$$U_X = \frac{C_x}{C_x + C_g} \cdot U_x = k_1 \cdot U_x, \tag{13}$$

$$U_A + k_1 \cdot U_x = U_{S1} \tag{14}.$$

Therefore, in the present embodiment, the measured voltage of the voltage dividing capacitor may be determined based on the sum of the voltage of the phase conductor to be measured and the interference voltage under the effect of different frequencies of the reference AC power supply and the voltages of the three phase conductors, and the interference voltage $U_X$ varies linearly with the change of the coupling capacitances. Based on the above relationship, by changing the coupling capacitance Cx between the voltage dividing capacitor and the three-phase conductor in the voltage measuring device and the coupling capacitance Cg between the voltage dividing capacitor and the ground (Cx and Cg may change with different proportions), the measured voltage in different states may be obtained, while the voltage of the phase conductor to be measured and the interference voltage are constant, so that the voltage of the phase conductor to be measured may be determined based on the measured voltages acquired before and after the change of the coupling capacitances without making the measuring device physically contact with the phase conductor to be measured.

In an embodiment, in the step S103, the determining, based on the measured voltage by the voltage measuring device before the adjustment of the coupling capacitances and the measured voltage by the voltage measuring device after the adjustment of the coupling capacitances, the voltage of the phase conductor of the three-phase conductor to be measured may include: acquiring a first phase voltage value and a first phase angle of the measured voltage by the voltage measuring device before the adjustment of the coupling capacitances, and acquiring a second phase voltage value and a second phase angle of the measured voltage by the voltage measuring device after the adjustment of the coupling capacitances; and determining, based on the first phase voltage value, the first phase angle, the second phase voltage value and the second phase angle, the voltage of the phase conductor to be measured in the case that the interference voltage varies linearly with the change of the coupling capacitances.

The first phase angle is an angle between the corresponding measured voltage and the voltage of the phase conductor to be measured, and the second phase angle is an angle between the corresponding measured voltage and the voltage of the phase conductor to be measured.

Figure 6:
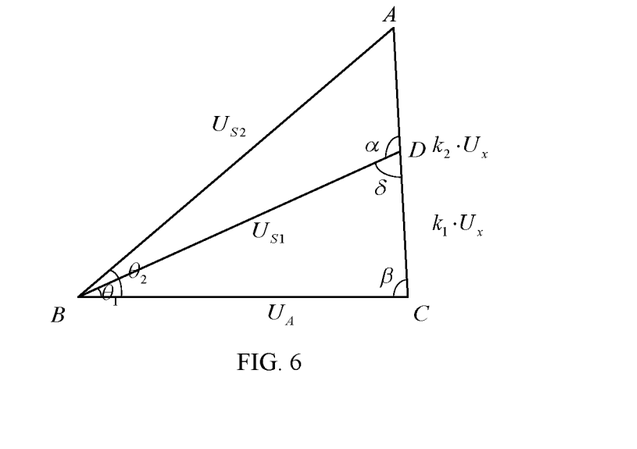
FIG. 6 is a diagram illustrating voltage phasors in an embodiment.

Specifically, based on the above derivation process and the equation (14), it is known that when the coupling capacitances changes, the corresponding measured voltage by the voltage measuring device is $U_{S2}$, denoted as:

$$U_A + k_2 \cdot U_x = U_{S2} \tag{15},$$

where the measured voltage $U_{S1}$ before the adjustment of the coupling capacitances, and the measured voltage $U_{S2}$ after the adjustment of the coupling capacitances are both phasors. Based on this, the voltage of the phase conductor to be measured may be transformed into a triangular solution. Specifically, the first phase voltage value and the first phase angle of the measured voltage by the voltage measuring device before the adjustment of the coupling capacitances may be acquired, and the second phase voltage value and the second phase angle of the measured voltage by the voltage measuring device after the adjustment of the coupling capacitances may be acquired. In the case that the interference voltage varies linearly with the change of the coupling capacitances, an angle between the interference voltage and the voltage of the phase conductor to be measured is kept constant, and the corresponding voltage phasors diagram may be shown in FIG. 6. Therefore, the voltage of the phase conductor to be measured may be determined based on the first phase voltage value, the first phase angle, the second phase voltage value and the second phase angle.

Since the first phase voltage value, the first phase angle, the second phase voltage value and the second phase angle are known information, the solution of the voltage $U_A$ to be measured may be transformed into solving for a side length BC in the triangle where $AB=U_{S2}$, $BD=U_{S1}$, $CD=k_1U_X$, and $AC=k_2U_X$, and based on the cosine theorem the following may be acquired:

$$AD=\sqrt{U_{S1}^2+U_{S2}^2-2U_{S1}\cdot U_{S2}\cos(\theta_2-\theta_1)},$$

$$\alpha = \arccos\left(\frac{AD^2 + U_{S1}^2 - U_{S2}^2}{2\cdot AD\cdot U_{S1}}\right),$$

$$\delta=180°-\alpha$$

$$\beta=180°-\theta_1-\delta.$$

Based on the sine theorem, in the triangle BCD, $$\frac{\delta}{U_A} = \frac{\beta}{U_{S1}}.$$

Therefore, a voltage amplitude of the conductor to be measured may be denoted as:

$$U_A = \frac{\delta\cdot U_{S1}}{\beta}.$$

In an example, the phase angle θ of the phase conductor to be measured may be acquired based on a phase-locked circuit for the voltage corresponding to the phase conductor to be measured, so that both the voltage and the phase angle of the phase conductor to be measured may be acquired.

In the present embodiment, by changing the coupling capacitances between the voltage measuring device and the conductor to be measured, the voltage of the three-phase conductor to be measured may be acquired quickly and accurately while filtering out electric field interference of the other two phases in the three-phase conductor, which can effectively improve the measurement efficiency of the voltage of the three-phase conductor.

In an embodiment, the determining the current measured voltage by the voltage measuring device may include: determining a current voltage of the voltage dividing capacitor in the voltage measuring device; acquiring a preset voltage of the reference AC power supply in the voltage measuring device; and determining, based on the current voltage of the voltage dividing capacitor and the preset voltage of the reference AC power supply, the current measured voltage by the voltage measuring device.

In a specific implementation, the voltage of the voltage dividing capacitor in the voltage measuring device may be measured to acquire a current measured voltage of the voltage dividing capacitor. Moreover, the preset voltage of the reference AC power supply in the voltage measuring device may be acquired, and a sine signal corresponding to the preset voltage may be artificially pre-set. Further, a voltage calculation may be performed based on the current voltage of the voltage dividing capacitor and the preset voltage of the reference AC power supply to acquire the current measured voltage by the voltage measuring device.

In the present embodiment, the measured voltage may be acquired by the directly measured and acquired voltage of the voltage dividing capacitor and the voltage of the reference AC power supply, providing a basis for the subsequent determination of the voltage of the phase conductor to be measured.

In an embodiment, the determining the current voltage of the voltage dividing capacitor in the voltage measuring device includes: acquiring a detected voltage of the voltage dividing capacitor in the voltage measuring device; and decomposing the detected voltage to obtain a first decomposition voltage of the voltage dividing capacitor under separate effect of the voltages of the three phase conductors at the frequency of the AC power supply, and a second decomposition voltage of the voltage dividing capacitor under separate effect of the reference AC power supply at the frequency of the reference AC power supply.

The detected voltage is a voltage collected under a combined effect of the reference AC power supply and the voltages of the three phase conductors.

Specifically, when the voltage dividing capacitor in the voltage measuring device forms the electrical coupling with the three-phase conductor, there are two voltage sources, i.e., the voltages of the three phase conductors and the reference AC power supply with different sinusoidal signal frequencies in the corresponding circuit. Therefore, when directly measuring the voltage of the voltage dividing capacitor, the detected voltage is an alternating voltage after superposition of the two sinusoidal signals.

In the present step, after acquiring the detected voltage of the voltage dividing capacitor, the voltage of the voltage dividing capacitor may be decomposed, for example, by a hardware processing method (e.g. filter circuit) or a software processing method (e.g. Fourier transform) to obtain the first decomposition voltage of the voltage dividing capacitor under the separate effect of the voltages of the three phase conductors at the frequency of the AC power supply, and the second decomposition voltage of the voltage dividing capacitor under the separate effect of the reference AC power supply at the frequency of the reference AC power supply. Further, the current voltage of the voltage dividing capacitor may be acquired based on the first decomposition voltage and the second decomposition voltage.

In an embodiment, the determining, based on the current voltage of the voltage dividing capacitor and the preset voltage of the reference AC power supply, the current measured voltage by the voltage measuring device includes: acquiring a ratio of the first decomposition voltage to the second decomposition voltage; and obtaining, based on a product of the ratio and the preset voltage of the reference AC power supply, the current measured voltage by the voltage measuring device.

Specifically, based on the derivation process of FIG. 5a and FIG. 5b, the ratio of the first decomposition voltage and the second decomposition voltage may be determined after the first decomposition voltage and the second decomposition voltage are obtained. Further, the current measured voltage by the voltage measuring device is acquired based on the product of the ratio and the preset voltage corresponding to the reference AC power supply.

It should be understood that although the individual steps in the flowcharts involved in the embodiments as described above are shown sequentially as indicated by the arrows, the steps are not necessarily performed sequentially in the order indicated by the arrows. Unless explicitly stated herein, these steps are performed in no strict order and they can be performed in any other order. Moreover, at least some of the steps in the flowcharts involved in the embodiments as described above may include multiple steps or multiple stages that are not necessarily performed at the same moment of completion, but may be performed at different moments, and the order in which these steps or stages are performed is not necessarily sequential, but may be performed alternately or alternately with other steps or at least some of the steps or stages in other steps.

Based on the same inventive concept, embodiments of the present disclosure also provide a voltage measuring apparatus for implementing the voltage measuring method as described above. The solution to the problem provided by the apparatus is similar to the implementation of the method documented above, so the specific limitations in the one or more embodiments of the voltage measuring apparatus provided below may be understood with reference to the limitations of the voltage measuring method above and will not be repeated here.

Figure 7:
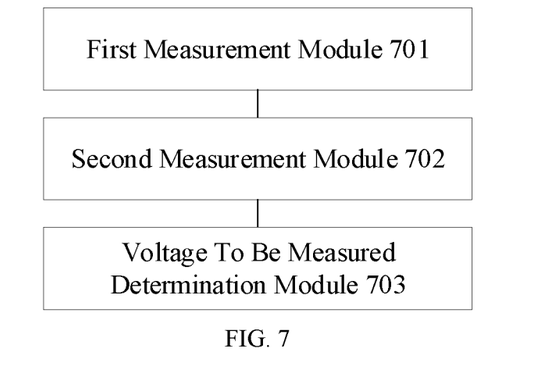
FIG. 7 is a block diagram illustrating a configuration of a voltage measuring apparatus in an embodiment.

In an embodiment, as shown in FIG. 7, a voltage measuring apparatus is provided. The apparatus includes: a first measurement module 701 configured to determine, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; a second measurement module 702 configured to adjust the coupling capacitances, and determine, by the voltage measuring device after the adjustment of the coupling capacitances, a current measured voltage; and a voltage to be measured determination module 703 configured to determine, based on the measured voltage by the voltage measuring device before the adjustment of the coupling capacitances and the measured voltage by the voltage measuring device after the adjustment of the coupling capacitances, a voltage of a phase conductor of the three-phase conductor to be measured.

In an embodiment, the measured voltage is determined, under an effect of different frequencies of the reference AC power supply and voltages of the three phase conductors, based on a sum of the voltage of the phase conductor to be measured and an interference voltage, and the interference voltage varies linearly with change of the coupling capacitances.

In an embodiment, the voltage to be measured determination module 703 is specifically configured to: acquire a first phase voltage value and a first phase angle of the measured voltage by the voltage measuring device before the adjustment of the coupling capacitances, and acquire a second phase voltage value and a second phase angle of the measured voltage by the voltage measuring device after the adjustment of the coupling capacitances; the first phase angle and the second phase angle being each an angle between the corresponding measured voltage and the voltage of the phase conductor to be measured; and determine, based on the first phase voltage value, the first phase angle, the second phase voltage value and the second phase angle, the voltage of the phase conductor to be measured in the case that the interference voltage varies linearly with the change of the coupling capacitances.

In an embodiment, the first measurement module 701 and/or the second measurement module 702 include: a voltage dividing capacitor determination sub-module configured to determine a current voltage of the voltage dividing capacitor in the voltage measuring device; a preset voltage acquisition sub-module configured to acquire a preset voltage of the reference AC power supply in the voltage measuring device; and a measured voltage calculation module configured to determine, based on the current voltage of the voltage dividing capacitor and the preset voltage of the reference AC power supply, the current measured voltage by the voltage measuring device.

In an embodiment, the voltage dividing capacitor determination sub-module is specifically configured to: acquire a detected voltage of the voltage dividing capacitor in the voltage measuring device; the detected voltage being a voltage collected under a combined effect of the reference AC power supply and the voltages of the three phase conductors; and decompose the detected voltage to obtain a first decomposition voltage of the voltage dividing capacitor under separate effect of the voltages of the three phase conductors at the frequency of the AC power supply, and a second decomposition voltage of the voltage dividing capacitor under separate effect of the reference AC power supply at the frequency of the reference AC power supply.

In an embodiment, the measured voltage calculation module is specifically configured to: acquire a ratio of the first decomposition voltage to the second decomposition voltage; and obtain, based on a product of the ratio and the preset voltage of the reference AC power supply, the current measured voltage by the voltage measuring device.

In an embodiment, the voltage measuring device further includes a toggle switch, as well as a first electrode plate, a second electrode plate and a third electrode plate used to form the coupling capacitances, and the first electrode plate, the voltage dividing capacitor, the reference AC power supply, the second electrode plate, the toggle switch and the third electrode plate are connected sequentially. The second measurement module 702 is specifically configured to: change a state of the toggle switch, and obtain adjusted coupling capacitances after change of the state of the toggle switch. The state of the toggle switch includes an open state or a closed state.

The individual modules in the above voltage measurement apparatus can be implemented in whole or in part by software, hardware and combinations thereof. Each of the above modules may be embedded in hardware form or independent of a processor in a computer device, or may be stored in software form on a memory in the computer device so that the processor can be called to perform the operations corresponding to each of the above modules.

In an embodiment, a computer device is provided, which may be a terminal. A diagram illustrating an internal configuration of the computer device may be shown in FIG. 8. The computer device includes a processor, a memory, an input/output interface, a communication interface, a display unit, and an input device. The processor, the memory and the input/output interface are connected via a system bus, and the communication interface, the display unit and the input device are connected to the system bus via the input/output interface. The processor of the computer device is configured to provide computing and control capabilities. The memory of the computer device includes a non-volatile storage medium and an internal memory. The non-volatile storage medium stores operating systems and computer programs. The internal memory provides an environment for the operation of operating systems and computer programs in non-volatile storage medium. The input/output interface of the computer device is configured to exchange information between the processor and external devices. The communication interface of the computer device is configured to communicate with external terminals in wired or wireless mode, which can be realized by WIFI, mobile cellular network, near field communication (NFC) or other technologies. The computer programs are executed by the processor in order to implement a voltage measuring method. The display unit of the computer device is configured to form a visually visible picture, which can be a display screen, a projection device or a virtual reality imaging device. The display screen can be an LCD or e-ink display, and the input device of the computer device can be a touch layer covered by the display screen, or a key, trackball or trackpad set on the housing of the computer device, or an external keyboard, trackpad or mouse, etc.

Figure 8:
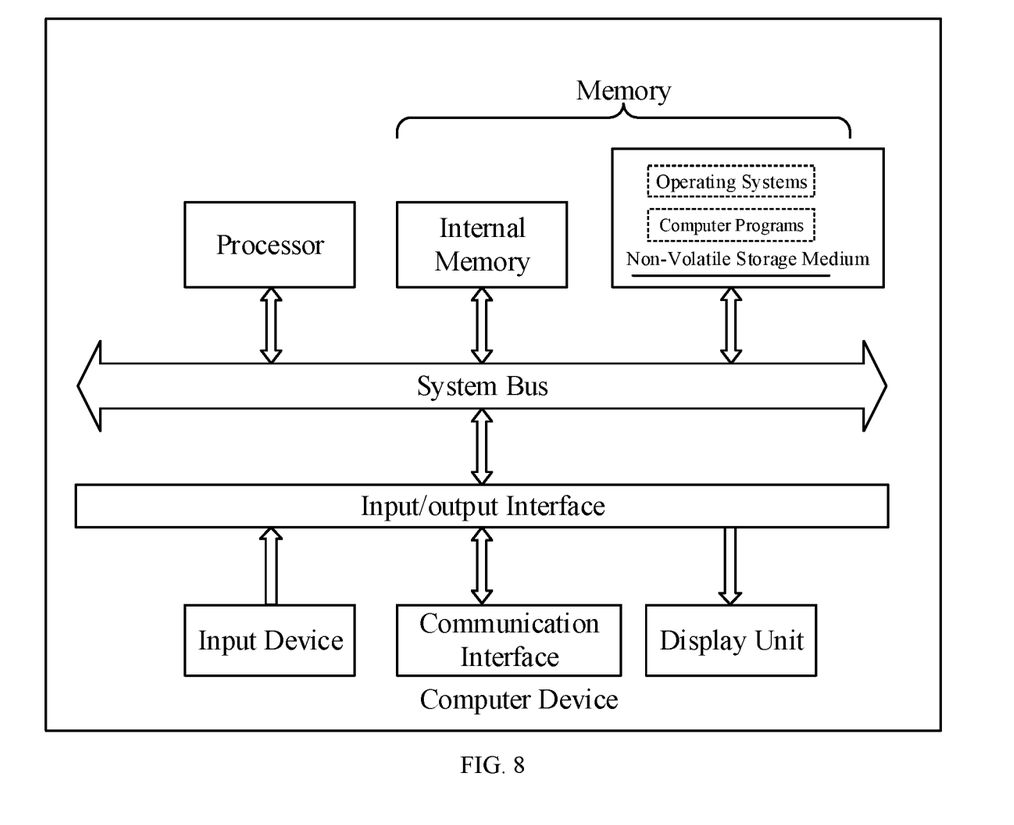
FIG. 8 is a diagram illustrating an internal configuration of a computer device in an embodiment.

It will be understood by those skilled in the art that the configuration illustrated in FIG. 8, which is only a block diagram of a portion of the configuration associated with the present disclosure scheme, does not constitute a limitation of the computer device to which the present disclosure scheme is applied, and that a specific computer device may include more or fewer components than shown in the figures, or combine certain components, or have a different arrangement of components.

In an embodiment, a computer device is provided, including a processor and a memory storing computer programs, the computer programs, when executed by the processor, cause the processor to: determine, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; adjust the coupling capacitances, and determine, by the voltage measuring device after the adjustment of the coupling capacitances, a current measured voltage; and determine, based on the measured voltage by the voltage measuring device before the adjustment of the coupling capacitances and the measured voltage by the voltage measuring device after the adjustment of the coupling capacitances, a voltage of a phase conductor of the three-phase conductor to be measured.

In an embodiment, the computer programs, when executed by the processor, further cause the processor to implement the steps in the other embodiments described above.

In an embodiment, a computer readable storage medium storing computer programs is provided, the computer programs, when executed by the processor, cause the processor to: determine, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; adjust the coupling capacitances, and determine, by the voltage measuring device after the adjustment of the coupling capacitances, a current measured voltage; and determine, based on the measured voltage by the voltage measuring device before the adjustment of the coupling capacitances and the measured voltage by the voltage measuring device after the adjustment of the coupling capacitances, a voltage of a phase conductor of the three-phase conductor to be measured.

In an embodiment, the computer programs, when executed by the processor, further cause the processor to implement the steps in the other embodiments described above.

In an embodiment, a computer program product is provided, including computer programs, the computer programs, when executed by the processor, cause the processor to: determine, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; adjust the coupling capacitances, and determine, by the voltage measuring device after the adjustment of the coupling capacitances, a current measured voltage; and determine, based on the measured voltage by the voltage measuring device before the adjustment of the coupling capacitances and the measured voltage by the voltage measuring device after the adjustment of the coupling capacitances, a voltage of a phase conductor of the three-phase conductor to be measured.

In an embodiment, the computer programs, when executed by the processor, further cause the processor to implement the steps in the other embodiments described above.

It should be noted that the user information (including but not limited to user device information, user personal information, etc.) and data (including but not limited to data used for analysis, stored data, displayed data, etc.) involved in the present disclosure are information and data authorized by the user or fully authorized by all parties, and the collection, use and processing of relevant data need to comply with relevant laws, regulations and standards of relevant countries and regions.

A person of ordinary skill in the art can understand that implementation of all or part of the processes in the methods of the above embodiments can be completed by instructing the relevant hardware through a computer program. The computer program may be stored in a non-volatile computer-readable storage medium. When the computer program is executed, it may include the processes in the embodiments of the above methods. Any reference to memory, database or other medium used in the embodiments provided in the present disclosure may include at least one of a non-volatile and a volatile memory. The non-volatile memory may include a read-only memory (ROM), a magnetic tape, a floppy disk, a flash memory, an optical memory, a high-density embedded non-volatile memory, a resistive random access memory (ReRAM), a magnetoresistive random access memory (MRAM), a ferroelectric random access memory (FRAM), a phase change memory (PCM), or a graphene memory, etc. The volatile memory may include a random access memory (RAM) or an external cache memory, etc. As an illustration rather than a limitation, the random access memory may be in various forms, such as a static random access memory (SRAM) or a dynamic random access memory (DRAM), etc. The databases involved in the embodiments provided by the present disclosure may include at least one of a relational database and a non-relational database. The non-relational database can include, without limitation, a blockchain-based distributed database, etc. The processor involved in the embodiments provided by the present disclosure may be a general purpose processor, a central processor, a graphics processor, a digital signal processor, a programmable logic device, a data processing logic device based on quantum computation, and the like, without limitation.

The technical features in the above embodiments can be combined arbitrarily. For concise description, not all possible combinations of the technical features in the above embodiments are described. However, all the combinations of the technical features are to be considered as falling within the scope described in this specification provided that they do not conflict with each other.

The above-mentioned embodiments only describe several implementations of the present disclosure, and their description is specific and detailed, but should not be understood as a limitation on the patent scope of the invention. It should be pointed out that for those skilled in the art may further make variations and improvements without departing from the conception of the present disclosure, and these all fall within the protection scope of the present disclosure. Therefore, the protection scope of the present disclosure should be subject to the appended claims.

What is claimed is:

1. A voltage measuring method, comprising:
determining, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; the measured voltage being determined, under an effect of different frequencies of the reference AC power supply and voltages of the three phase conductors, based on a sum of the voltage of the phase conductor to be measured and an interference voltage caused by conductors in the three-phase conductor other than the phase conductor to be measured, wherein the interference voltage varies linearly with change of the coupling capacitances, and the phase conductor to be measured is one of the three phase conductors;
adjusting the coupling capacitances, and determining, by the voltage measuring device after the adjustment of the coupling capacitances, a current measured voltage;
acquiring a first phase voltage value and a first phase angle of the measured voltage by the voltage measuring device before the adjustment of the coupling capacitances, and acquiring a second phase voltage value and a second phase angle of the measured voltage by the voltage measuring device after the adjustment of the coupling capacitances; the first phase angle and the second phase angle being each an angle between the corresponding measured voltage and the voltage of the phase conductor to be measured; and
determining, based on the first phase voltage value, the first phase angle, the second phase voltage value and the second phase angle, the voltage of the phase conductor to be measured in the case that the interference voltage varies linearly with the change of the coupling capacitances.

2. The voltage measuring method of claim 1, wherein the voltage measuring device further comprises a toggle switch, as well as a first electrode plate, a second electrode plate and a third electrode plate used to form the coupling capacitances, and the first electrode plate, the voltage dividing capacitor, the reference AC power supply, the second electrode plate, the toggle switch and the third electrode plate are connected sequentially, and wherein the adjusting the coupling capacitances comprises:
changing a state of the toggle switch, and obtaining adjusted coupling capacitances after change of the state of the toggle switch, the state of the toggle switch comprising an open state or a closed state.

3. The voltage measuring method of claim 2, wherein the second electrode plate and the third electrode plate are not connected in the open state, and the second electrode plate and the third electrode plate are connected in the closed state.

4. The voltage measuring method of claim 1, wherein the determining the current measured voltage by the voltage measuring device comprises:
determining a current voltage of the voltage dividing capacitor in the voltage measuring device;
acquiring a preset voltage of the reference AC power supply in the voltage measuring device; and
determining, based on the current voltage of the voltage dividing capacitor and the preset voltage of the reference AC power supply, the current measured voltage by the voltage measuring device.

5. The voltage measuring method of claim 4, wherein the determining the current voltage of the voltage dividing capacitor in the voltage measuring device comprises:
acquiring a detected voltage of the voltage dividing capacitor in the voltage measuring device; the detected voltage being a voltage collected under a combined effect of the reference AC power supply and the voltages of the three phase conductors; and
decomposing the detected voltage to obtain a first decomposition voltage of the voltage dividing capacitor under separate effect of the voltages of the three phase conductors at the frequency of the AC power supply, and a second decomposition voltage of the voltage dividing capacitor under separate effect of the reference AC power supply at the frequency of the reference AC power supply.

6. The voltage measuring method of claim 5, wherein the determining, based on the current voltage of the voltage dividing capacitor and the preset voltage of the reference AC power supply, the current measured voltage by the voltage measuring device comprises:
acquiring a ratio of the first decomposition voltage to the second decomposition voltage; and obtaining, based on a product of the ratio and the preset voltage of the reference AC power supply, the current measured voltage by the voltage measuring device.

7. A computer device comprising a processor and a memory storing computer programs, wherein the computer programs, when executed by the processor, causes the processor to:
- determine, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; the measured voltage being determined, under an effect of different frequencies of the reference AC power supply and voltages of the three phase conductors, based on a sum of the voltage of the phase conductor to be measured and an interference voltage caused by conductors in the three-phase conductor other than the phase conductor to be measured, wherein the interference voltage varies linearly with change of the coupling capacitances, and the phase conductor to be measured is one of the three phase conductors;
- adjust the coupling capacitances, and determine, by the voltage measuring device after the adjustment of the coupling capacitances, a current measured voltage;
- acquire a first phase voltage value and a first phase angle of the measured voltage by the voltage measuring device before the adjustment of the coupling capacitances, and acquire a second phase voltage value and a second phase angle of the measured voltage by the voltage measuring device after the adjustment of the coupling capacitances; the first phase angle and the second phase angle being each an angle between the corresponding measured voltage and the voltage of the phase conductor to be measured; and
- determine, based on the first phase voltage value, the first phase angle, the second phase voltage value and the second phase angle, the voltage of the phase conductor to be measured in the case that the interference voltage varies linearly with the change of the coupling capacitances.

8. The computer device of claim 7, wherein the determining the current measured voltage by the voltage measuring device comprises:
- determining a current voltage of the voltage dividing capacitor in the voltage measuring device;
- acquiring a preset voltage of the reference AC power supply in the voltage measuring device; and
- determining, based on the current voltage of the voltage dividing capacitor and the preset voltage of the reference AC power supply, the current measured voltage by the voltage measuring device.

9. The computer device of claim 8, wherein the determining the current voltage of the voltage dividing capacitor in the voltage measuring device comprises:
- acquiring a detected voltage of the voltage dividing capacitor in the voltage measuring device; the detected voltage being a voltage collected under a combined effect of the reference AC power supply and the voltages of the three phase conductors; and
- decomposing the detected voltage to obtain a first decomposition voltage of the voltage dividing capacitor under separate effect of the voltages of the three phase conductors at the frequency of the AC power supply, and a second decomposition voltage of the voltage dividing capacitor under separate effect of the reference AC power supply at the frequency of the reference AC power supply.

10. The computer device of claim 9, wherein the determining, based on the current voltage of the voltage dividing capacitor and the preset voltage of the reference AC power supply, the current measured voltage by the voltage measuring device comprises:
- acquiring a ratio of the first decomposition voltage to the second decomposition voltage; and
- obtaining, based on a product of the ratio and the preset voltage of the reference AC power supply, the current measured voltage by the voltage measuring device.

11. The computer device of claim 7, wherein the voltage measuring device further comprises a toggle switch, as well as a first electrode plate, a second electrode plate and a third electrode plate used to form the coupling capacitances, and the first electrode plate, the voltage dividing capacitor, the reference AC power supply, the second electrode plate, the toggle switch and the third electrode plate are connected sequentially, and wherein the adjusting the coupling capacitances comprises:
- changing a state of the toggle switch, and obtaining adjusted coupling capacitances after change of the state of the toggle switch, the state of the toggle switch comprising an open state or a closed state.

12. The computer device of claim 11, wherein the second electrode plate and the third electrode plate are not connected in the open state, and the second electrode plate and the third electrode plate are connected in the closed state.

13. A non-transitory computer-readable storage medium storing computer programs, wherein the computer programs, when executed by a processor, causes the processor to:
- determine, by a voltage measuring device when the voltage measuring device is electrically coupled to a three-phase conductor through a voltage dividing capacitor in the voltage measuring device, a current measured voltage, the measured voltage being determined by measuring a voltage of the voltage dividing capacitor in the voltage measuring device, the voltage dividing capacitor being powered by a reference AC power supply, the voltage of the voltage dividing capacitor being related to voltages of three phase conductors and coupling capacitances between the voltage dividing capacitor and the three phase conductors; the measured voltage being determined, under an effect of different frequencies of the reference AC power supply and voltages of the three phase conductors, based on a sum of the voltage of the phase conductor to be measured and an interference voltage caused by conductors in the three-phase conductor other than the phase conductor to be measured, wherein the interference voltage varies linearly with change of the coupling capacitances, and the phase conductor to be measured is one of the three phase conductors;
- adjust the coupling capacitances, and determine, by the voltage measuring device after the adjustment of the coupling capacitances, a current measured voltage;
- acquire a first phase voltage value and a first phase angle of the measured voltage by the voltage measuring device before the adjustment of the coupling capacitances, and acquire a second phase voltage value and a second phase angle of the measured voltage by the voltage measuring device after the adjustment of the coupling capacitances; the first phase angle and the second phase angle being each an angle between the corresponding measured voltage and the voltage of the phase conductor to be measured; and determine, based on the first phase voltage value, the first phase angle, the second phase voltage value and the second phase angle, the voltage of the phase conductor to be measured in the case that the interference voltage varies linearly with the change of the coupling capacitances.

14. The non-transitory computer-readable storage medium of claim 13, wherein the determining the current measured voltage by the voltage measuring device comprises:

determining a current voltage of the voltage dividing capacitor in the voltage measuring device;

acquiring a preset voltage of the reference AC power supply in the voltage measuring device; and determining, based on the current voltage of the voltage dividing capacitor and the preset voltage of the reference AC power supply, the current measured voltage by the voltage measuring device.

15. The non-transitory computer-readable storage medium of claim 14, wherein the determining the current voltage of the voltage dividing capacitor in the voltage measuring device comprises:

acquiring a detected voltage of the voltage dividing capacitor in the voltage measuring device; the detected voltage being a voltage collected under a combined effect of the reference AC power supply and the voltages of the three phase conductors; and decomposing the detected voltage to obtain a first decomposition voltage of the voltage dividing capacitor under separate effect of the voltages of the three phase conductors at the frequency of the AC power supply, and a second decomposition voltage of the voltage dividing capacitor under separate effect of the reference AC power supply at the frequency of the reference AC power supply.

16. The non-transitory computer-readable storage medium of claim 15, wherein the determining, based on the current voltage of the voltage dividing capacitor and the preset voltage of the reference AC power supply, the current measured voltage by the voltage measuring device comprises:

acquiring a ratio of the first decomposition voltage to the second decomposition voltage; and obtaining, based on a product of the ratio and the preset voltage of the reference AC power supply, the current measured voltage by the voltage measuring device.

17. The non-transitory computer-readable storage medium of claim 13, wherein the voltage measuring device further comprises a toggle switch, as well as a first electrode plate, a second electrode plate and a third electrode plate used to form the coupling capacitances, and the first electrode plate, the voltage dividing capacitor, the reference AC power supply, the second electrode plate, the toggle switch and the third electrode plate are connected sequentially, and wherein the adjusting the coupling capacitances comprises:

changing a state of the toggle switch, and obtaining adjusted coupling capacitances after change of the state of the toggle switch, the state of the toggle switch comprising an open state or a closed state.

18. The non-transitory computer-readable storage medium of claim 17, wherein the second electrode plate and the third electrode plate are not connected in the open state, and the second electrode plate and the third electrode plate are connected in the closed state.

* * * * *